(12) United States Patent
Mizumura et al.

(10) Patent No.: US 9,001,425 B2
(45) Date of Patent: Apr. 7, 2015

(54) MICROLENS ARRAY AND SCANNING EXPOSURE DEVICE USING SAME

(75) Inventors: Michinobu Mizumura, Yokohama (JP); Makoto Hatanaka, Yokohama (JP)

(73) Assignee: V Technology Co., Ltd., Yokohama-shi, Kanagawa (JP)

(*) Notice: Subject to any disclaimer, the term of this patent is extended or adjusted under 35 U.S.C. 154(b) by 0 days.

(21) Appl. No.: 14/232,733

(22) PCT Filed: Jul. 23, 2012

(86) PCT No.: PCT/JP2012/068624
§ 371 (c)(1),
(2), (4) Date: Jan. 14, 2014

(87) PCT Pub. No.: WO2013/018572
PCT Pub. Date: Feb. 7, 2013

(65) Prior Publication Data
US 2014/0152968 A1  Jun. 5, 2014

(30) Foreign Application Priority Data

Jul. 29, 2011  (JP) ................. 2011-167819

(51) Int. Cl.
G02B 27/10 (2006.01)
G03F 7/20 (2006.01)
G02B 27/09 (2006.01)
G02B 7/00 (2006.01)
G02B 3/00 (2006.01)

(52) U.S. Cl.
CPC .......... *G03F 7/7015* (2013.01); *G02B 27/0961* (2013.01); *G02B 7/00* (2013.01); *G02B 3/00* (2013.01); *G02B 3/0056* (2013.01); *G02B 3/0062* (2013.01); *G02B 3/0075* (2013.01); *G03F 7/70275* (2013.01)

(58) Field of Classification Search
CPC ...... G02B 3/0075; G02B 3/0056; G02B 3/00; G02B 3/0062; G02B 7/00; G02B 27/0961; G03F 7/70258
USPC ................................. 359/619–622
See application file for complete search history.

(56) References Cited

U.S. PATENT DOCUMENTS

2002/0045028 A1* 4/2002 Teshima et al. ............... 428/156
2013/0128253 A1* 5/2013 Mizumura et al. ............ 355/67

FOREIGN PATENT DOCUMENTS

| JP | 9-244255(A) | 9/1997 |
| JP | 10-104405(A) | 4/1998 |
| JP | 2007-3829(A) | 1/2007 |

(Continued)

OTHER PUBLICATIONS

International Search Report in PCT/JP2012/068624 dated Oct. 16, 2012 with English translation thereof.

*Primary Examiner* — James Phan
(74) *Attorney, Agent, or Firm* — McGinn IP Law Group, PLLC.

(57) ABSTRACT

In this microlens array, unitary microlens arrays are respectively stacked onto an upper surface and lower surface of a glass plate, and each of the unitary microlens arrays is supported by an upper plate and a lower plate. Marks for alignment are formed on each of the unitary microlens arrays and on the glass plate, and the unitary microlens arrays and the glass plate are stacked onto each other aligned by these marks. This makes it possible to prevent ununiform exposure in scanning exposure using a plurality of microlens arrays.

6 Claims, 7 Drawing Sheets

(56) References Cited

FOREIGN PATENT DOCUMENTS

| JP | 2008-310213(A) | 12/2008 |
| WO | WO 2010/101465 A1 | 9/2010 |
| WO | WO 2011/068014 A1 | 6/2011 |

* cited by examiner (a)

2-1
 2-2

11

2-3
 2-4

(b)

2-1
 2-2
 11
 2-3
 2-4

(c)

MICROLENS ARRAY AND SCANNING EXPOSURE DEVICE USING SAME

TECHNICAL FIELD

The present invention relates to an exposure device for exposing a mask pattern onto a substrate using a microlens array in which microlenses are two-dimensionally arrayed, as well as a microlens array used therefor.

BACKGROUND ART

A scanning exposure device using a microlens array in which microlenses are two-dimensionally arrayed has been recently proposed (patent document 1). In such a scanning exposure device, a plurality of the microlens arrays are arrayed in one direction, and a substrate and mask are moved in a relative fashion in relation to the microlens arrays and an exposure light source in a direction perpendicular to the direction of this arraying, thereby scanning the exposure light through the mask and forming on the substrate an exposure pattern formed by the holes of the mask.

FIG. 8 is a drawing illustrating a microlens array in a conventional exposure device. As illustrated in FIG. 8, in a conventional exposure device, a microlens array has a plurality of microlens array chips 20 arranged in a direction perpendicular to a scanning direction 5 on a light-blocking substrate 6 in, for example, two rows of four each, the microlens array 2 being arrayed so that, as seen in the scanning direction 5, the two rows of microlens array chips 20 are staggered with three of the four microlens array chips 20 of a later stage being each arranged in between the four microlens array chips 20 of the earlier stage. This causes the full range of an exposure region in the direction perpendicular to the scanning direction 5 in a substrate 4 to be exposed by the two rows of microlens array chips 20.

As illustrated in FIG. 9, each of the microlens array chips 20 has, for example, a four-array/eight-lens configuration, and has a structure in which four unit micro lens arrays 20-1, 20-2, 20-3, 20-4 are stacked. Each of the unitary microlens arrays 20-1 to 20-4 is constituted of two lenses and, as illustrated in FIG. 10, the unitary microlens arrays 20-1 to 20-4 of each of the microlens array chips 20 are affixed to each other at an edge. This causes an exposure light to be temporarily converged between the unitary microlens array 20-2 and the unitary microlens array 20-3, and further to form an image on a substrate that is below the unitary microlens array 20-4. That is to say, an inverted same-size image of a mask 3 is formed between the unitary microlens array 20-2 and the unitary microlens array 20-3, and an erect same-size image of the mask 3 is formed on the substrate.

PRIOR ART DOCUMENTS

Patent Literature

Patent document 1: Japanese laid-open patent publication 2007-3829

DISCLOSURE OF THE INVENTION

Problems the Invention is Intended to Solve

However, the following problems have emerged in the conventional scanning exposure device described above. As stated above, with the scanning exposure light obtained when conventional microlens arrays are used, an erect same-size image of the mask 3 is formed on the substrate 4 by scanning an exposure light source and the microlens array 2 in a relative fashion with respect to the mask 3 and the substrate 4. Accordingly, for each of the microlens array chips 20, in a case of displacement of the position of adhesion at the edges between the four unitary microlens arrays 20-1 to 20-4, either the position where an image is formed by the mask pattern on the substrate 4 changes or the amount of exposure light with which the substrate 4 is irradiated changes, which causes an ununiform exposure to take place. Also, having a structure in which a plurality of unitary microlens arrays is stacked causes the conventional microlens array chips 20 to be more susceptible to cumulative displacement of the position of adhesion.

Further, the recent demand for higher efficiency in scanning exposure processes has caused the mask 3 to have an extended width reaching, for example, about 1500 mm. The microlens array chip 20 cannot be scaled up to match the size of the wider mask 3, and even were it possible to produce such a wider microlens array chip, the costs to produce same would be very high. Accordingly, in the conventional scanning exposure illustrated in FIG. 8, a plurality of microlens array chips 20 is arranged so as to correspond to the width of the mask 3. When, in such an exposure device in which a plurality of microlens array chips 20 is used, the microlens array chips 20 that are arranged in a staggered manner and are adjacent have a gap formed therebetween as seen in the scanning direction 5, then this gap causes a region which either is unexposed or which receives very little exposure light to remain on the substrate, whereas, in a case where the microlens array chips 20 are arranged so as to overlap with each other as seen in the scanning direction 5, then the substrate at the overlapped portions receives a considerable amount of irradiated light, creating an overexposed region and likewise causing an ununiform exposure.

An objective of the present invention is to provide a microlens array and a scanning exposure device using same with which ununiform exposure can be prevented in scanning exposure using a plurality of microlens arrays.

Means for Solving the Problems

A microlens array according to the present invention, in which the microlens array is moved along with a light source for emitting an exposure light, the exposure light coming from the light source is transmitted through a pattern formed on a mask, and an erect-same-size image of the mask pattern is formed through the microlens array by the light transmitted through the mask, comprises:

a glass plate, and a plurality of unitary microlens arrays which are stacked onto an upper surface and a lower surface of the glass plate, and are stacked on one another with a plurality of microlenses in a two-dimensional arrangement.

The unitary microlens arrays are constituted by arranging, in a second direction orthogonal to a first direction, a plurality of columns of microlenses constituted by arraying a plurality of microlenses in the first direction. A microlens column group is constituted of a predetermined number of columns of microlenses. A plurality of the columns of microlenses is arranged offset by increments of a fixed distance in the first direction in each of the microlens column groups. And a plurality of the microlens column groups is arranged in the second direction.

Alignment marks are formed on each of the unitary microlens arrays and the glass plate and the unitary microlens arrays and the glass plate are stacked onto each other aligned by the marks.

In the microlens array as in the present invention, for example, borders of each of the unitary microlens arrays in the first direction are inclined with respect to the second direction in correspondence with the fact that columns of microlenses that are adjacent in said second direction are offset by the fixed distance in the first direction. In such a case, the microlens array chips are constituted of the unitary microlens arrays and the glass plate, a plurality of the microlens array chips is arrayed in the first direction, and microlens array chips that are adjacent in the first direction have the microlenses thereof shifted by one column or a plurality of columns in the second direction, this shifting forming a gap between the microlens array chips.

Also, for example, polygonal viewing field diaphragms having a polygonal aperture are arranged at positions of inverted image formation between the unitary microlens arrays, and aperture diaphragms that have a circular aperture and limit the numerical aperture of each of the microlenses are arranged, at least in part, of a section of maximum enlargement of the exposure light between said unitary microlens arrays. The microlens array also has, for example, a holder for holding the unitary microlens arrays.

A scanning exposure device according to the present invention comprises:

a light source for emitting exposure light;

a mask on which the exposure light coming from the light source is incident and in which a pattern with which to expose a substrate is formed;

a microlens array for forming on the substrate an erect same-size image of the pattern, light transmitted through the mask being incident thereon; and a movement device for moving the light source and the microlens array in a relative fashion with respect to the mask and the substrate.

The micro-lens array comprises:

a glass plate, and a plurality of unitary microlens arrays which are stacked onto an upper surface and a lower surface of the glass plate, and are stacked on one another with a plurality of microlenses in a two-dimensional arrangement.

The unitary microlens arrays are constituted by arranging, in a second direction, which is a movement direction, a plurality of columns of microlenses constituted by arraying a plurality of microlenses in a first direction, which is a direction orthogonal to the movement direction. A microlens column group is constituted of a predetermined number of columns of microlenses. A plurality of the columns of microlenses is arranged offset by increments of a fixed distance in the first direction in each of the microlens column groups. And a plurality of the microlens column groups is arranged in the second direction.

Alignment marks are formed on each of the unitary microlens arrays and the glass plate and the unitary microlens arrays and the glass plate are stacked onto each other with alignment by the marks.

Effects of the Invention

In the present invention, a plurality of unitary microlens arrays is stacked on the upper surface and lower surface of a glass plate, reducing the likelihood of cumulative displacement in the positions of stacking of the unitary microlens arrays. Alignment marks are formed in the unitary microlens arrays and in the glass plate, and the unitary microlens arrays and the glass plate are stacked atop one another, aligned by the marks. Accordingly, it is possible to reliably prevent the positions of stacking of the unitary microlens arrays from shifting, and prevent the incidence of exposure variation during scanning exposure.

BEST MODE FOR CARRYING OUT THE INVENTION

Figure 1:
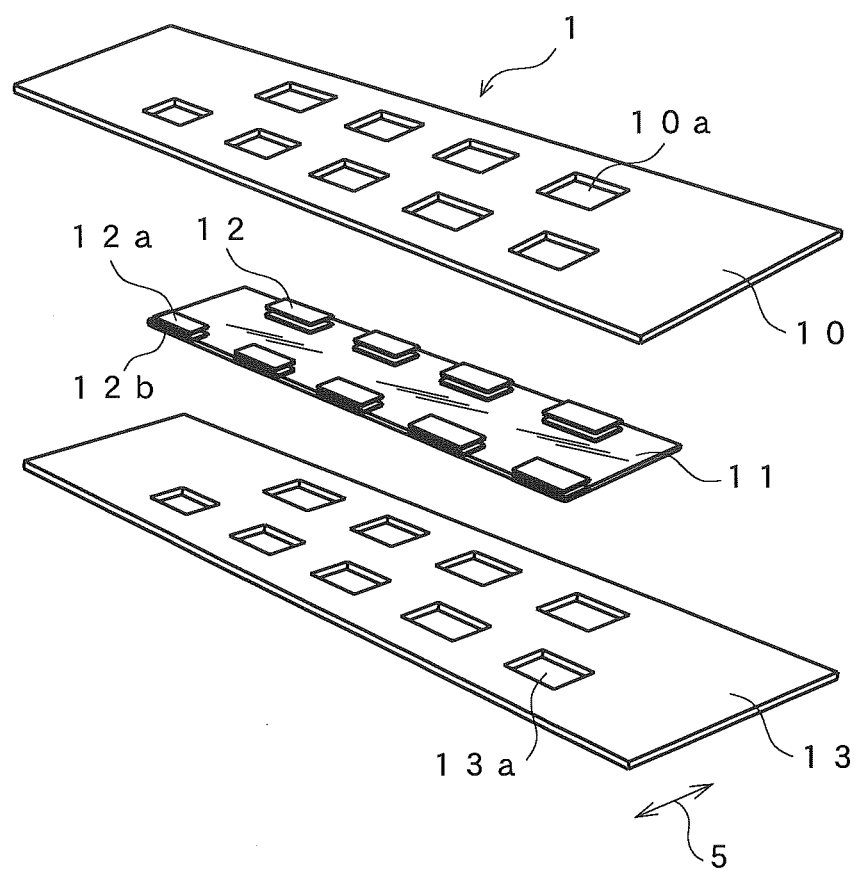
FIG. 1 is a drawing illustrating a configuration of a microlens array as in an embodiment of the present invention.
Figure 2:
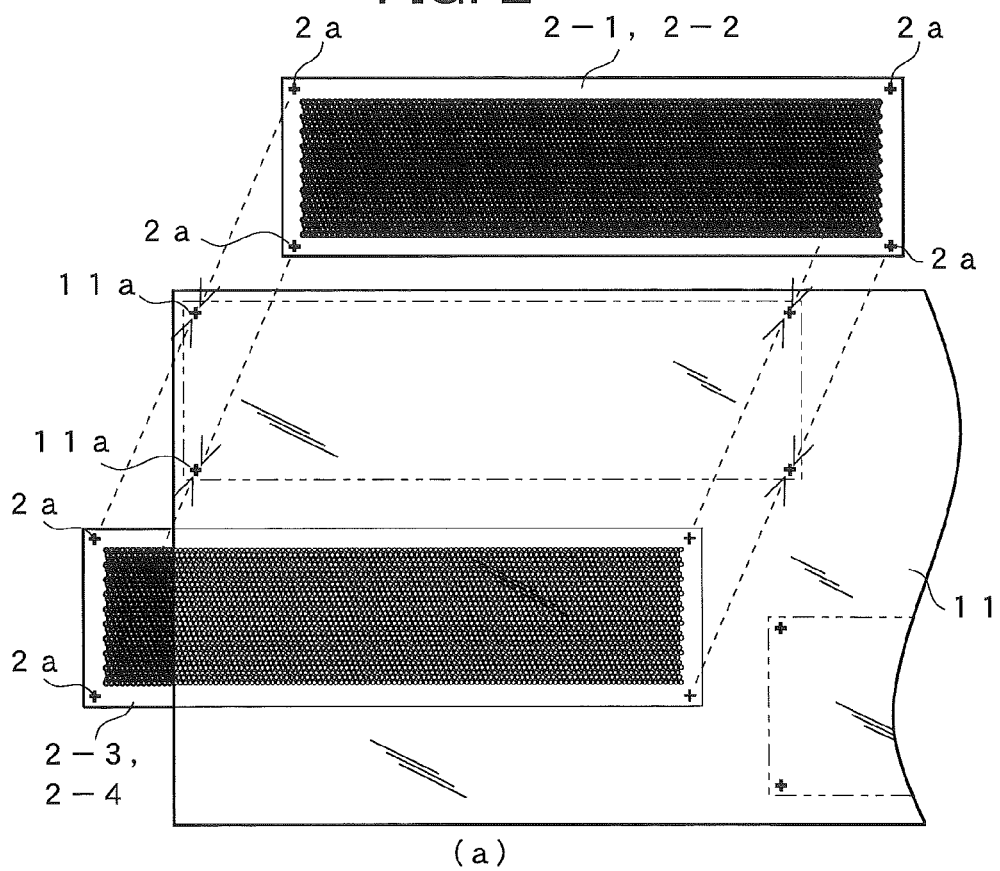
FIGS. 2A to 2C are drawings illustrating a method for affixing unitary microlens arrays to a glass plate in a microlens array as in an embodiment of the present invention.
Figure 2:
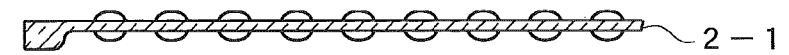
Figure 2:
Figure 2:
Figure 2:
Figure 2:
Figure 2:
Figure 2:
Figure 2:
Figure 2:
Figure 2:
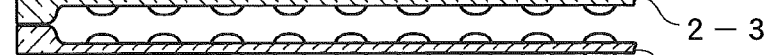
Figure 2:
Figure 2:
Figure 3:
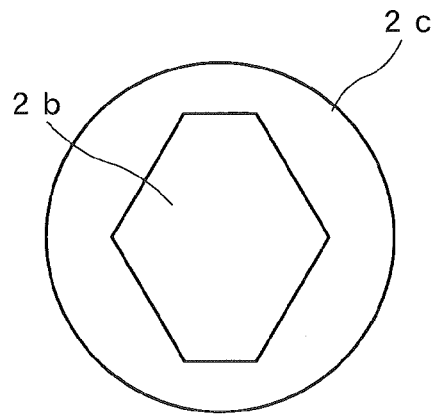
FIG. 3 is a drawing illustrating the shape of a diaphragm of the microlenses.
Figure 4:
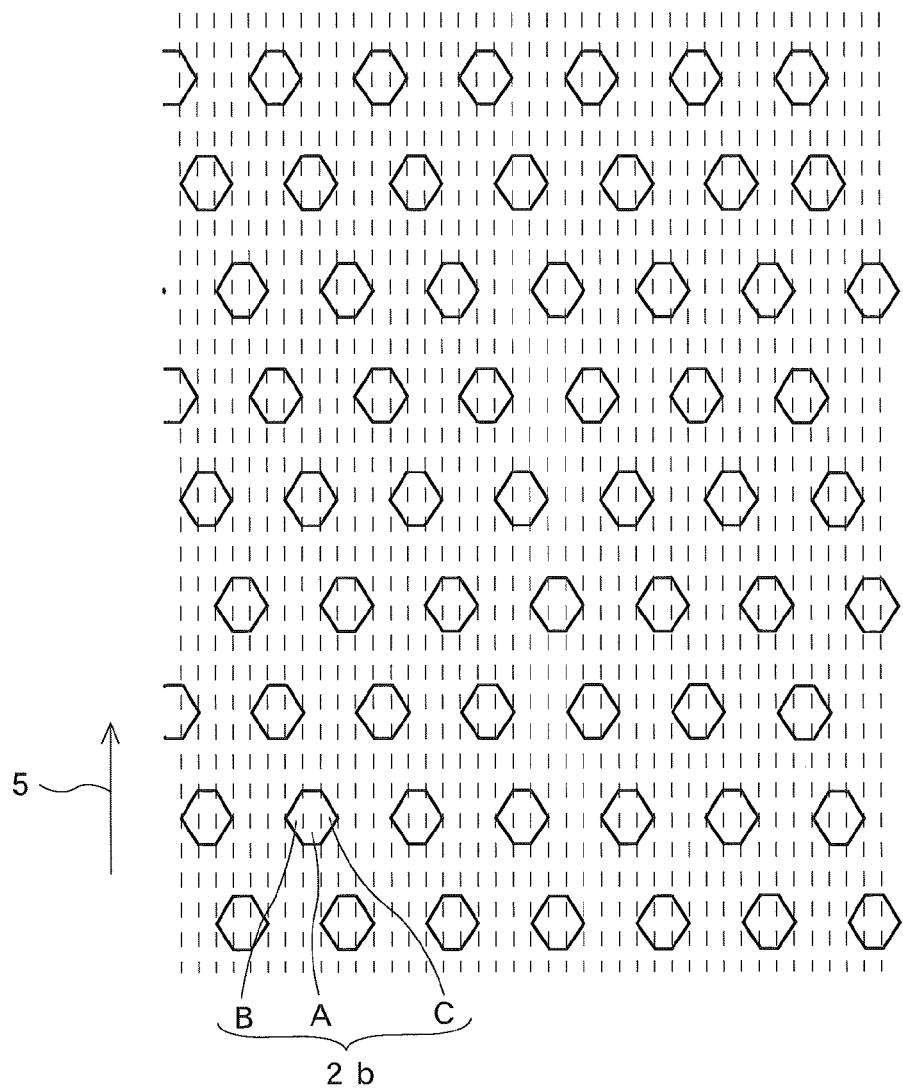
FIG. 4 is a drawing illustrating a pattern on a substrate that has passed through the apertures of an inverted image formation position of the microlens array.

Embodiments of the present invention shall now be described below in greater detail with reference to the accompanying drawings. FIG. 1 illustrates a configuration of a microlens array as in an embodiment of the present invention; FIGS. 2A to 2C illustrate a method for adhering unitary microlens arrays to a glass plate in a microlens array as in an embodiment of the present invention; FIG. 3 illustrates the shape of a diaphragm of the microlenses; and FIG. 4 illustrates a pattern on a substrate that has passed through the apertures of an inverted image formation position of the microlens array. In the present first embodiment, microlens array chips 12 in a microlens array 1 are provided in a rectangular shape as seen in plan view.

Figure 8:
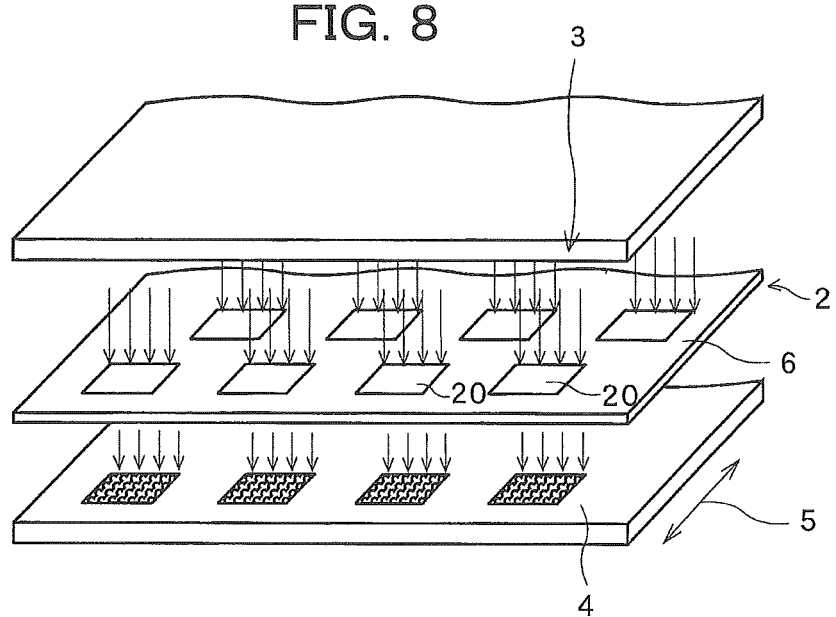
FIG. 8 is a drawing illustrating the arrangement of the mask, the microlens array, and the substrate in an exposure device.

The microlens array 1 of the present embodiment, like the conventional exposure device illustrated in FIG. 8, is one where exposure light emitted from an exposure light source and then transmitted through a mask 3 is incident, forming an erect same-size image of the mask 3 on a substrate 4; the microlens array 1 moves in one direction (a scanning direction 5) in a relative fashion with respect to the mask 3 and the substrate 4 along with the exposure light source, thus scanning the exposure light onto the substrate 4. That is to say, the exposure light emitted from the exposure light source is guided to the mask 3 via an optical system such as a plane mirror, and the microlens array 1 is irradiated with the exposure light that is transmitted through the mask 3, an image of a pattern formed on the mask 3 then being formed on the substrate 4 by the microlens array 1. The exposure light source, the optical system, and the microlens array can be moved in a certain direction as an integrated unit, and the substrate 4 and the mask 3 are fixedly arranged. The exposure light source and the microlens array 1 move in a relative fashion with respect to the mask 3 and the substrate 4 in one direction, the exposure light being thereby scanned on the substrate 4; in a case where the substrate is a "one-take" substrate in which one substrate is produced from a glass substrate, then one such scan causes the full surface of the substrate to be exposed.

Next, a mode of exposure by the microlens array of the present embodiment shall be described in greater detail. The microlens array 1, which is configured by two-dimensionally arranging microlenses, is arranged instead of the microlens array 2 above the substrate to be exposed 4, which is a glass substrate or the like. Further, the mask 3 is arranged above the microlens array 1, and the exposure light source is arranged above the mask 3. The mask 3 is a transparent substrate on a bottom surface of which a light-blocking film composed of a Cr film is formed; the exposure light is transmitted through holes formed in the Cr film and is converged onto the substrate by the microlens array 1. As described above, in the present embodiment, for example, the substrate 4 and the mask 3 are fixed, and the exposure light source and the microlens array 1 move synchronously in the direction of the scanning direction 5, the exposure light coming from the exposure light source being thereby transmitted through the mask 3 and scanned in the scanning direction 5 on the substrate 4. The movement of the exposure light source and the microlens array 1 is driven by a drive source of a movement device as appropriate. Alternatively, the exposure light source and the microlens array 1 may be fixed and the substrate 4 and the mask 3 may be moved.

As illustrated in FIG. 1, the microlens array 1 of the present embodiment is one where an upper surface and lower surface of a glass plate 11 each have thereon a plurality of unitary microlens arrays that are stacked and fixed by, for example, adhesion. That is to say, a microlens array chip 12 is constituted of the glass plate 11 and the unitary microlens arrays that are stacked onto the glass plate 11. As illustrated in FIG. 1, in the present embodiment, there are nine of the microlens array chips 12 provided; as seen in the scanning direction 5, four microlens array chips 12 of a later stage are arranged between five microlens array chips 12 of an earlier stage. Two unitary microlens arrays 12a, 12b, of an upper layer and a lower layer stacked onto the glass plate 11, are retained by an upper plate 10 and a lower plate 13 on which openings 10a, 13a are formed. That is to say, the upper plate 10 and the lower plate 13 sandwich the glass plate 11 in a state where the unitary microlens arrays 12a, 12b are respectively fitted into the openings 10a, 13a, thereby causing the unitary microlens arrays 12a, 12b to be retained. The upper plate 10 and/or the lower plate 13 is constituted of, for example, a light-blocking material, and the openings 10a, 13a are provided to each of the retaining plates so as to correspond to the positions of the microlenses in the microlens array chips 12.

In the present embodiment, as illustrated in FIG. 2C, two unitary microlens arrays 12a (2-1, 2-2) are stacked onto an upper surface of the glass plate 11, and two unitary microlens arrays 12b (2-3, 2-4) are stacked onto a lower surface of the glass plate 11. As illustrated in FIG. 2A, a plurality of alignment marks 11a serving as indicators for the positions where each of the unitary microlens arrays 2-1 to 2-4 are to be stacked is formed on the glass plate 11 and, similarly, alignment marks 2a are formed in each of the unitary microlens arrays 2-1 to 2-4 at four corners of edges that will not be part of a light-transmitting region. Each of the unitary microlens arrays 2-1 to 2-4 is then stacked two on the upper surface and two on the lower surface of the glass plate 11 with alignment by the alignment marks 11a of the glass plate 11 and the alignment marks 2a of the unitary microlens arrays (FIG. 2B), thereby constituting one microlens array chip 12 (FIG. 2C). However, although in the present embodiment the alignment marks 11a, 2a are each provided to four positions in the glass plate 11 and in the unitary microlens arrays 2-1 to 2-4, there is no limitation thereto; the alignment marks 11a, 2a need only be provided to two or more positions each.

Figure 9:
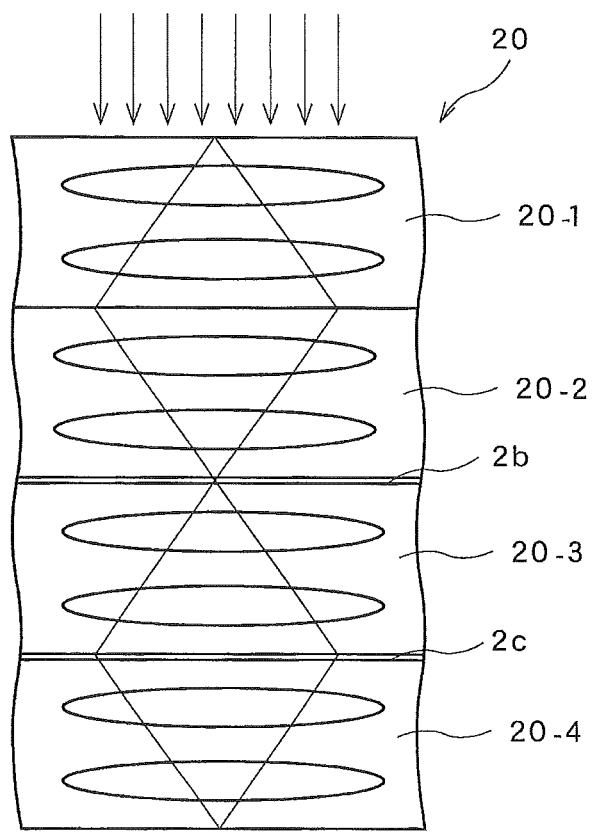
FIG. 9 is a cross-sectional view illustrating the arrangement of unitary microlens arrays.
Figure 10:
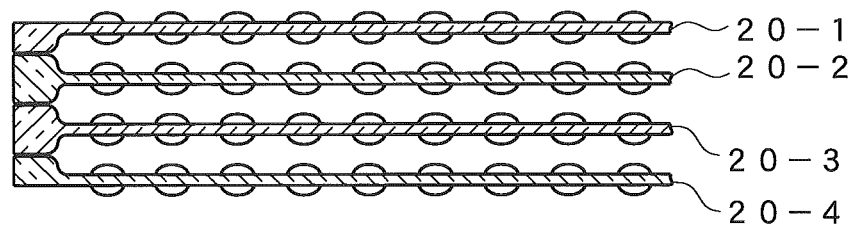
FIG. 10 is a cross-sectional view illustrating sections of adhesion between the unitary microlens arrays.

In the present embodiment, similarly with respect to the conventional microlens array chip illustrated in FIG. 9, the microlenses in each of the microlens array chips 12 are, for example, in a four-array/eight-lens configuration, and each of the unitary microlens arrays 2-1 and the like is constituted of an optical system represented by two convex lenses. This causes the exposure light to be converged between the unitary microlens array 2-2 and the unitary microlens array 2-3, and furthermore causes an image to be formed on the substrate below the unitary microlens array 2-4. A hexagonal viewing field diaphragm 2b is arranged between the unitary microlens array 2-2 and the unitary microlens array 2-3, and a circular aperture diaphragm 2c is arranged between the unitary microlens array 2-3 and the unitary microlens array 2-4. The aperture diaphragm 2c limits the numerical aperture (NA) of each of the microlenses, and the hexagonal viewing field diaphragm 2b narrows the viewing field to a hexagon close to a position of image formation. Though not depicted in FIG. 2, in the present embodiment the hexagonal viewing field diaphragm 2b is provided between the unitary microlens array 2-2 and the glass plate 11, between the glass plate 11 and the unitary microlens array 2-3, or to the glass plate 11, which are illustrated in FIG. 2C. The hexagonal viewing field aperture 2b and the aperture diaphragm 2c are provided to each of the microlenses, and, for each of the microlenses, a light-transmitting region of the microlens is shaped into a circle by the aperture diaphragm 2c and an exposure region for exposure light on the substrate is shaped into a hexagon. The hexagonal viewing field aperture 2b is shaped so as to be a hexagonal aperture in the aperture diaphragm 2c of the microlenses, as illustrated in FIG. 3. Accordingly, when scanning is stopped, this hexagonal viewing field aperture 2b causes only the region that is surrounded by the hexagon illustrated in FIG. 4 on the substrate 4 to be irradiated with the exposure light that has been transmitted through the microlens array 1. The hexagonal viewing field aperture 2b and the circular aperture diaphragm 2c can be patterned by a Cr film as a film that does not transmit light.

Each of the unitary microlens arrays 2-1 to 2-4 is configured by arranging in the scanning direction 5 (a second direction) a plurality of columns of microlenses that are configured by arraying a plurality of microlenses in a direction (a first direction) orthogonal to the scanning direction 5, and a predetermined number of columns of microlenses constitutes a microlens column group. In each of the microlens column groups, a plurality of columns of microlens is arranged displaced from one another by a certain distance in the first direction, and a plurality of the microlens column groups is arranged in the scanning direction 5 (second direction). In the present embodiment, three columns of microlenses arranged side by side in the scanning direction constitute a microlens column group.

The mode of arrangement of the microlenses shall now be described with reference to FIG. 4. FIG. 4 is a drawing illustrating a mode of arrangement of the microlenses as positions of the hexagonal viewing field diaphragms 2b of the microlenses in order to illustrate a mode of arrangement of each of the microlenses in each of the microlens array chips 12. As illustrated in FIG. 4, the microlenses are successively arranged with somewhat of a lateral offset with respect to the scanning direction 5. The hexagonal viewing field diaphragms 2b are divided into a middle rectangular portion A and triangular portions B and C on both sides as seen in the scanning direction 5 thereof. In FIG. 4, the dashed lines are line segments linking each of the corners of the hexagon of the hexagonal viewing field diaphragms 2b in the scanning direction 5. As illustrated in FIG. 4, with respect to each of the columns in the direction perpendicular to the scanning direction 5, the microlenses are arranged so that, when three columns of hexagonal viewing field diaphragms 2b are viewed with respect to the scanning direction 5, then the triangular portions C on the right side of a given first column of hexagonal viewing field diaphragms 2b overlaps with the triangular portions B on the left side of a second column of hexagonal viewing field diaphragms 2b adjacent thereto to the rear in the scanning direction (the opposite side of the arrows), and the triangular portions B on the left side of the first column of hexagonal viewing field diaphragms 2b overlap with the triangular portions C on the right side of a third column. In this manner, with respect to the scanning direction 5, three columns of microlenses are arranged to form a set. In other words, a fourth column of microlenses is arranged at the same position as the first column of microlenses with respect to the direction perpendicular to the scanning direction 5. Herein, in the three columns of hexagonal viewing field diaphragms 2b, the linear density of the total surface area of the two triangular portions B and C overlapping in the scanning direction 5 is the same as the linear density of the surface area of the middle rectangular portion A when the surface area of the triangular portions B and the surface area of the triangular portions C of the second column of adjacent hexagonal viewing field diaphragms 2b are each added together. The term "linear density" here refers to the aperture area of the hexagonal viewing field diaphragms 2b per unit length in the direction perpendicular to the scanning direction 5. That is to say, the total surface area of the triangular portions B and C is the area of a rectangular portion for which the length is the base of the triangular portions B and C and the width is the height of the triangular portions B and C. This rectangular portion is the same length as the length of the rectangular portions A, and thus in a comparison with the aperture area (linear density) per unit light with respect to the direction perpendicular to the scanning direction 5, the linear densities of the triangular portions B and C and the linear density of the rectangular portion A are the same with respect to the three columns of microlenses. Therefore, when the substrate 4 is subjected to scanning with the three columns of microlenses, a uniform amount of exposure light will be received in the entire region thereof with respect to the direction perpendicular to the scanning direction 5. As such, a number of columns of microlenses amounting to a whole number multiple of three is arranged in each of the microlens array chips 12, causing the entire region of the substrate to receive a uniform amount of exposure light by a single scan.

In the microlens array 1 configured in this manner, during the irradiation with the exposure light from the exposure light source, the substrate 4 is moved in a relative fashion with respect to the microlens array 1, and scanning the substrate 4 with the exposure light causes the substrate 4 to receive a uniform amount of exposure light throughout the entire region to be exposed on the substrate 4. In other words, the substrate 4 does not receive a spotted exposure light corresponding to the positions of the microlenses, but rather the regions between the microlenses in one column are exposed by the microlenses of the other columns, and the substrate 4 receives a uniform exposure light in the entire region to be exposed as if receiving a planar exposure. Then, the pattern projected onto the substrate 4 is not the shape of the hexagonal viewing field diaphragms 2b and the aperture diaphragms 2c, but is determined by a mask pattern (exposure pattern) that is formed in the holes of the Cr film (light-blocking film) of the mask 3.

In the present embodiment, a region where microlenses are not arranged is present at the end of each of the microlens array chips 12, and the number of microlenses at the ends of the microlens array chips 12 as seen in the scanning direction 5 is fewer than the other regions. Accordingly, arranging the microlens array chips 12 in a staggered manner necessitates the ends of the microlens array chips 12 being arranged so as to overlap as seen in the scanning direction 5. That is to say, the deficit of microlenses at the ends of the microlens array chips 12 is distributed between adjacent microlens array chips and the pitch of each of the microlenses in the direction orthogonal to the scanning direction 5 is aligned with respect to the gap between adjacent microlens array chips 12 as well, resulting in an equal number of microlenses arranged side by side in the scanning direction across a plurality of microlens array chips. Accordingly, in the microlens array in which a plurality of microlens array chips are arrayed, too, the transmitted light have a constant linear density, thereby making it possible to prevent non-uniformity in the amount of irradiated light.

The operation of the exposure device of the present embodiment configured as described above shall be described next. First, the substrate 4 is conveyed to a predetermined exposure position of the exposure device. In this state, exposure light is emitted from the exposure light source. The exposure light emitted from the exposure light source is guided to the mask 3 via an optical system such as a planar mirror. Then, the microlens array 1 is irradiated with the exposure light that is transmitted through the mask 3.

The exposure light guided to the microlens array 1 is first transmitted through the openings 10a of the upper plate 10 and is incident on the microlens array chips 12. At this time, some of the light incident on the microlens array 1 is blocked by the upper plate 10. The light incident on each of the microlens array chips 12 is transmitted through the unitary microlens arrays 2-1, 2-2 stacked on the upper surface of the glass plate 11, and inverted same-size images of the mask 3 are formed between the unitary microlens array 2-2 and the unitary microlens array 2-3. The hexagonal viewing field diaphragms 2b are arranged at these image-forming positions, and the hexagonal viewing field diaphragms 2b shape the transmitted light to a hexagon. The exposure light transmitted through the hexagonal viewing field diaphragms 2c and the glass plate 11 is transmitted to the unitary microlens array 2-3, the aperture diaphragms 2c, and the unitary microlens array 2-4 stacked on the lower surface of the glass plate 11, and thereafter transmitted through the openings 13a of the lower plate 13, thus forming an erect same-size image of the mask 3 on the substrate 4. This image is formed so as to correspond to the positions of each of the microlenses in each of the microlens array chips 12, and is shaped so as to be a hexagon. The microlens array 1 of the present embodiment is configured by stacking the microlens array chips 12 for forming the erect same-size image of the mask 3 on the upper surface and lower surface of the glass plate 11, and therefore there is less likely to be cumulative displacement of the positions of stacking of the unitary microlens arrays compared to a case where four unitary microlens arrays are stacked. The alignment marks 2a, 11a are formed in the unitary microlens arrays 2- to 2-4 and in the glass plate 11, respectively, and the unitary microlens arrays 2-1 to 2-4 and the glass plate 11 are aligned together by the marks and stacked atop one another. Accordingly, the accuracy of the positions of adhesion of each of the unitary microlens arrays is high. This causes the erect same-size image of the pattern of the mask 3 to be formed at high positional accuracy on the substrate 4.

In this state, for example, the substrate 4 and the mask 3 are fixed, and the microlens array 1 and the exposure light source are moved in the scanning direction 5. In association with the scanning of the exposure light, the region of transmission of the exposure light in the mask 3 moves sequentially, and the light transmitted through each of the microlens array chips 12 forms a strip-shaped exposure region on the substrate 4. At this time, the plurality of unitary microlens arrays constituting each of the microlens array chips 12 is without deviation in the position of adhesion thereof, and accordingly no deviation is also produced in the pitch between microlenses positioned at the ends of adjacent microlens array chips 12 as seen in the scanning direction 5. Accordingly, the microlenses of all of the microlens array chips 12 have the same pitch in the direction orthogonal to the scanning direction 5, and the number of microlenses is the same between the ends of the microlens chips 12 and the other regions, with respect to the scanning direction 5. As such, even in a case such as in the present embodiment in which the microlens array is divided into the plurality (nine in FIG. 1) of microlens array chips 12, the portions linking adjacent microlens array chips 12 together as seen in the scanning direction 5 still will not suffer a difference in the amount of transmitted light nor an ununiform exposure.

Figure 5:
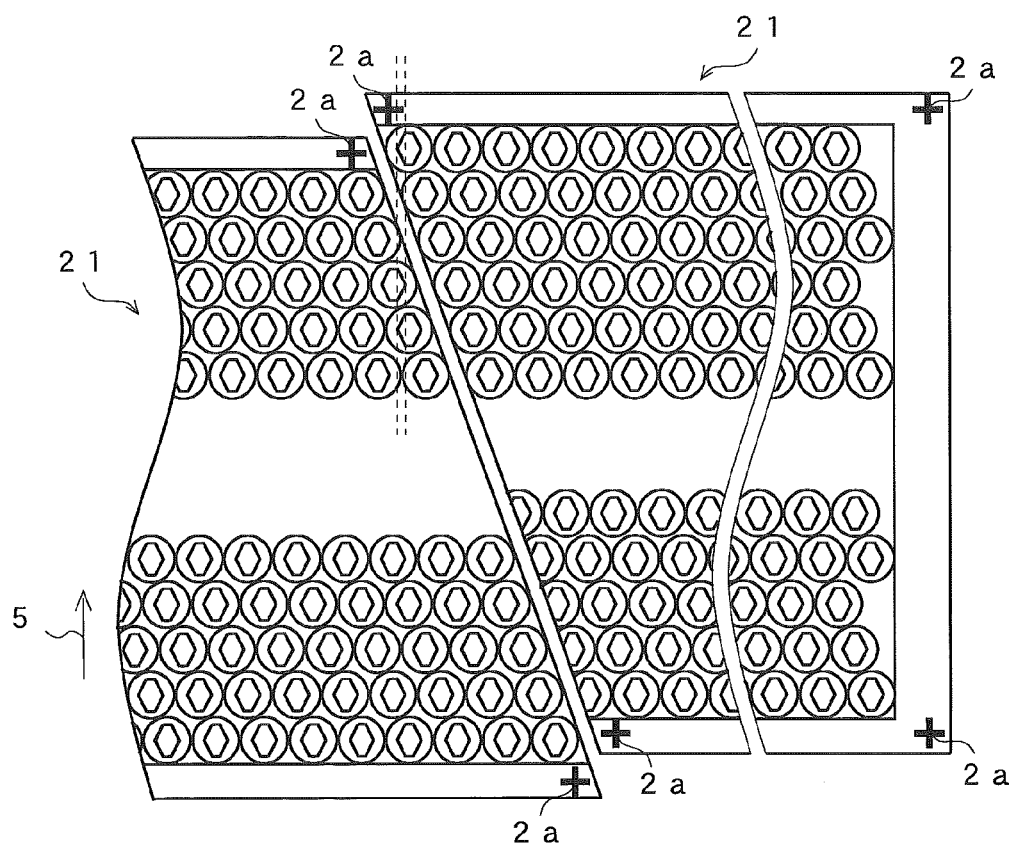
FIG. 5 is a plan view illustrating the arrangement of ends of a plurality of microlens array chips in a microlens array as in a second embodiment of the present invention.

A microlens array as in a second embodiment of the present invention shall now be described. FIG. 5 is a plan view illustrating the arrangement of ends of a plurality of microlens array chips in the microlens array chips as in the second embodiment of the present invention. The first embodiment describes a case where each of the microlens array chips 12 is provided in a rectangular shape as seen in plan view, but it is difficult to produce unitary microlens arrays having such a rectangular shape. Namely, production costs are lower when each of the unitary microlens arrays is produced by cutting a ready-made plate-shaped microlens array. However, in a case such as is illustrated in FIG. 4, where each of the microlenses of the microlens array chips were arrayed in a direction orthogonal to the scanning direction 5 and moreover the microlenses are arranged inclined with respect to the scanning direction between columns of microlenses that are adjacent in the scanning direction 5, then the microlenses that are positioned at the ends will be cut into when the ready-made microlens array is cut to a rectangular shape. That is to say, the lens viewing field region of each of the microlenses in the microlens array chips is determined by the hexagonal viewing field diaphragm 2b, and the numerical aperture (NA) of the transmitted light of each of the microlenses is limited by the circular aperture diaphragm 2c, which is larger than the hexagonal viewing field diaphragm 2b, but in a case where the microlens arrays are cut to a rectangular shape, then both the hexagonal viewing field diaphragm 2b and the aperture diaphragm 2c will be cut into. This causes cut-up microlenses to remain at the borders of the microlens arrays after cutting. Accordingly, in a case where the microlens arrays are configured by arranging these microlens arrays after cutting, then portions linking together microlens array chips that are adjacent as seen in the scanning direction 5 will include cut-up microlenses, and the exposure light transmitted through these portions produces a difference in the amount of transmitted light and causes an ununiform exposure to be generated.

Each of the unitary microlens arrays constituting the microlens array chips is produced by, for example, cutting ready-made microlens arrays, but in ready-made microlens array plates, the columns of microlenses are configured, for example, by arranging the microlenses so as to be parallel to the long edges, and each of the microlenses is offset by a predetermined pitch in the direction of the long edges between adjacent columns of microlenses. That is to say, each of the microlenses is arranged in a direction inclined with respect to the long edges of the microlens array plates between adjacent columns of microlenses. Accordingly, the microlens arrays, when being installed in the exposure device, are arranged so that the long edges of each of the microlens array chips are directed to be orthogonal to the scanning directions, and each of the microlenses of the microlens array chips are arranged at the same pitch in the direction orthogonal to the scanning direction 5 and a direction inclined with respect thereto. In the present embodiment, in order to eliminate ununiform exposure produced by the cutting of the microlens array chips, the ready-made microlens arrays are cut in a direction inclined with respect to the long edges so as to correspond to the arrangement where each of the columns of microlenses is shifted in the direction in which the long edges extend in columns of microlenses that are adjacent in the scanning direction 5, as illustrated in FIG. 5. For example, the unitary microlens arrays are produced by cutting ready-made microlens arrays as follows, and these unitary microlens arrays are stacked to constitute the microlens array chips 21. That is to say, as illustrated in FIG. 5, the ready-made microlens arrays are cut parallel to a common tangent of the circular aperture diaphragms 2c in columns of microlenses that are adjacent as seen in plan view, to obtain unitary microlens arrays that have borders inclined with respect to the long edges of the ready-made microlens arrays; these unitary microlens arrays are stacked to constitute the microlens array chips. This causes the arrangement of microlenses in adjacent columns of microlenses and the cutting line of the microlens arrays to be parallel, and causes microlenses that are cut into on the cutting line to no longer exist. Accordingly, an ununiform exposure due to the transmitted light of cut-up microlenses does not take place.

In this manner, the borders of the microlens array chips are provided at an incline, thereby making it possible for the microlens array chips 21 to be arranged in close proximity to one another, as illustrated in FIG. 5. Accordingly, in comparison to the first embodiment, in which each of the microlens array chips is provided in a rectangle, the length of the microlens array overall in the scanning direction can be greatly reduced. In this case, the length of the microlens array overall in the scanning direction is shortest, which is preferable, in a case where all of the columns of microlenses are arranged so as to be aligned in the direction orthogonal to the scanning direction between the adjacent microlens array chips. However, in such a case, because the adjacent microlens array chips are arranged so as to be in contact with one another, in some instances a problem emerges when the unitary microlens array chips are being stacked, such as where adjacent unitary microlens arrays interfere with each other. In the present embodiment, however, in the microlens array chips 21 that are adjacent in the direction orthogonal to the scanning direction 5, each of the columns of microlenses is arranged with one or a plurality of columns of shifting in the scanning direction 5 with respect to one another. This forms a gap between the adjacent microlens array chips. The microlens array is therefore easy to produce without the occurrence of such problems as interference between the unitary microlens arrays.

In the present embodiment, as well, the positions of adhesion of the plurality of unitary microlens arrays constituting the microlens array chips 21 are defined by the alignment marks 11a provided to the glass plate 11 and the marks 2a provided to each of the unitary microlens arrays. In the present embodiment, the alignment marks 11a of the glass plate are provided so as to correspond to the arrangement of the microlens array chips 21 illustrated in FIG. 5, and, for example, are provided to positions with shifting in the scanning direction 5 commensurate to one or multiple times the pitch of each of the columns of microlenses in the scanning direction 5 so as to correspond to the shifting between the columns of microlens arrays in the scanning direction 5 in the adjacent microlens array chips 21. The marks 11a corresponding to the adjacent microlens array chips are then at a very small distance from one another compared to the case where the microlens array chips are in a rectangular shape. The unitary microlens arrays, which have inclined borders, are aligned by the marks 2a provided to the edges thereof to match the marks 11a of the glass plate and are affixed to the glass plate 11. Because the unitary microlens arrays are affixed with the gap remaining between the adjacent unitary microlens arrays, however, a plurality of unitary microlens arrays is aligned at high precision and stacked onto the glass plate 11 without interfering with one another. Then, as illustrated in FIG. 5, it is possible to constitute a microlens array chip 21 having a certain number of microlens arrays as seen in the scanning direction 5; no difference will be produced in the amount of transmitted light at the portions linking adjacent microlens array chips together, and the occurrence of ununiform exposure can be reliably prevented. That is to say, in the example in FIG. 5, in the leftmost microlens of the uppermost stage in the microlens array chip 21 on the right side, the triangular portion on the left side thereof corresponds to the triangular portion on the right side in the rightmost microlens on the third stage from the top in the microlens array chip 21 on the left side, and the linear density of the total area thereof is equal to the linear density of the other regions. Accordingly, no ununiform exposure due to differences arising in the amount of transmitted light is created at the portions that link adjacent microlens array chips to one another as seen in the scanning direction 5.

Figure 6:
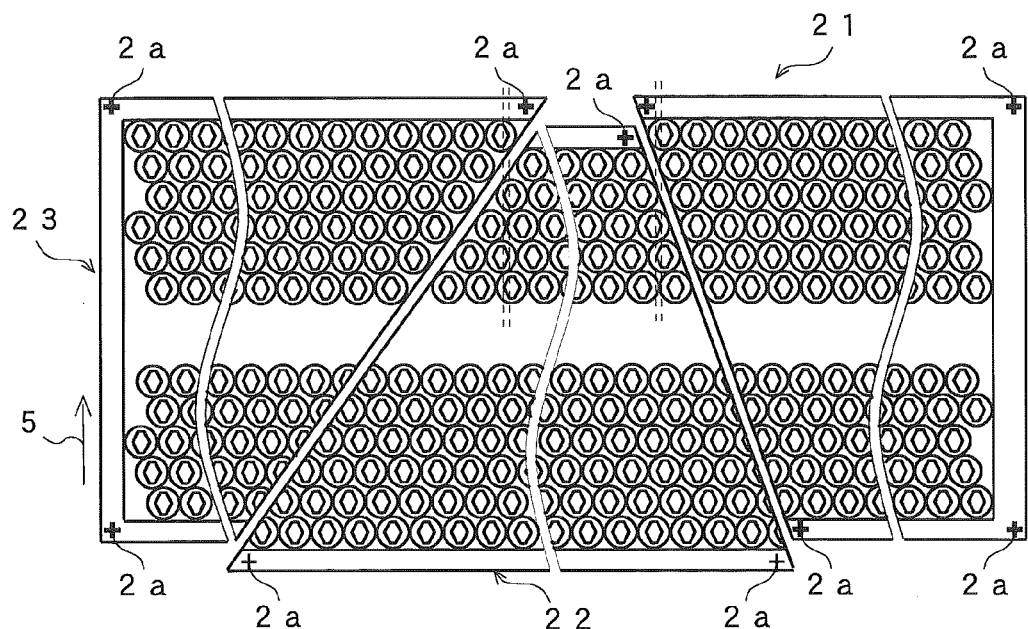
FIG. 6 is a plan view illustrating the arrangement of ends of a plurality of microlens array chips in a microlens array as in a third embodiment of the present invention.

A microlens array as in a third embodiment of the present invention shall be described next. FIG. 6 is a plan view illustrating the arrangement of ends of a plurality of microlens array chips in the microlens array as in the third embodiment of the present invention. As illustrated in FIG. 5, the second embodiment describes a case of using a microlens array chip obtained by cutting one of the ends of a ready-made microlens array at an incline, but in the present embodiment, as illustrated in FIG. 6, a middle microlens array chip 22 has the two ends of a ready-made microlens array cut at an incline. That is to say, the microlens array chip 22 is provided in a trapezoidal shape with the two ends of a ready-made microlens array cut in two directions inclined with respect to the long ends. In this case, too, the two ends of a ready-made microlens array are cut so as to be, for example, parallel to the common tangent of the circular aperture diaphragms 2c in adjacent columns of microlenses as seen in plan view, thus producing a unitary microlens array that has inclined borders; the unitary microlens arrays are then stacked to constitute a microlens array chip. This causes the arrangement of microlenses in adjacent columns of microlenses and the cutting line of the microlens arrays to be parallel, and causes microlenses that are cut into on the cutting line to no longer exist. Accordingly, an ununiform exposure due to the transmitted light of cut-up microlenses does not take place. As illustrated in FIG. 6, in the present embodiment, a microlens array chip 23 configured so that the direction of inclination of the borders is the same direction as that of the other end of the microlens array chip 22 is arranged at the other end side of the microlens array chip 22. At the other end side of the microlens array chip 22, too, each of the columns of microlenses is arranged with one column or a plurality of columns of shifting in the scanning direction between the microlens array chip 23 and the microlens array chip 22. This forms a gap between the adjacent microlens array chips. The microlens array is therefore easy to produce without the occurrence of such problems as interference between the unitary microlens arrays.

In the present embodiment, as well, constituting the microlens array chips 21 to 23 by producing and then stacking together unitary microlens arrays obtained by cutting ready-made microlens arrays at an incline with respect to the long ends makes it possible to constitute the microlens array chips 21 to 23 having the inclined borders. Accordingly, each of the microlens array chips can be arranged in very close proximity to one another, and in comparison to a case where each of the microlens array chips is rectangular and arranged in a staggered fashion, the length of the microlens array overall in the scanning direction can be greatly reduced.

Also, the positions of adhesion of the plurality of unitary microlens arrays constituting the microlens array chips 21 to 23 are defined by the alignment marks 11a provided to the glass plate 11 and the marks 2a provided to each of the unitary microlens arrays. That is to say, the alignment marks 11a of the glass plate are provided so as to correspond to the arrangement of the microlens array chips 21 to 23 illustrated in FIG. 6, and, for example, are provided to positions with shifting in the scanning direction 5 commensurate to one or multiple times the pitch of each of the columns of microlenses in the scanning direction 5 so as to correspond to the shifting between the columns of microlens arrays in the scanning direction 5 in the adjacent microlens array chips 21 to 23. In the present embodiment, as well, the marks 11a corresponding to the adjacent microlens array chips are much closer to each other compared to the case where the shape of the microlens array chips is rectangular, but because the unitary microlens arrays are affixed with a gap remaining between adjacent unitary microlens arrays, the plurality of unitary microlens arrays will not interfere with one another, and are stacked onto the glass plate 11 with high precision of alignment. Then, as illustrated in FIG. 6, it is possible to constitute microlens array chips 21 to 23 having a certain number of microlens arrays, as seen in the scanning direction 5; no difference will be produced in the amount of transmitted light at the portions linking adjacent microlens array chips together, and the occurrence of ununiform exposure can be reliably prevented. That is to say, in the example in FIG. 6, in the rightmost microlens of the uppermost stage in the microlens array chip 23 on the left side, the triangular portion on the right side thereof corresponds to the triangular portion on the left side in the leftmost microlens on the second stage from the top in the microlens array chip 22 on the right side, and the linear density of the total area thereof is equal to the linear density of the other regions.

A modification of the microlens array as in the present third embodiment shall be described next. In the third embodiment, the microlens array chip 22 is constituted of a unitary microlens array that has been cut at both ends with an incline in different directions, but, for example, it would be possible to produce a parallelogram-shaped unitary microlens array with the same direction of cutting for both ends of the microlens array, stack a plurality thereof to constitute a parallelogram-shaped microlens array chip 220, and array a plurality thereof to constitute a microlens array, as illustrated in FIG. 7.

Figure 7:
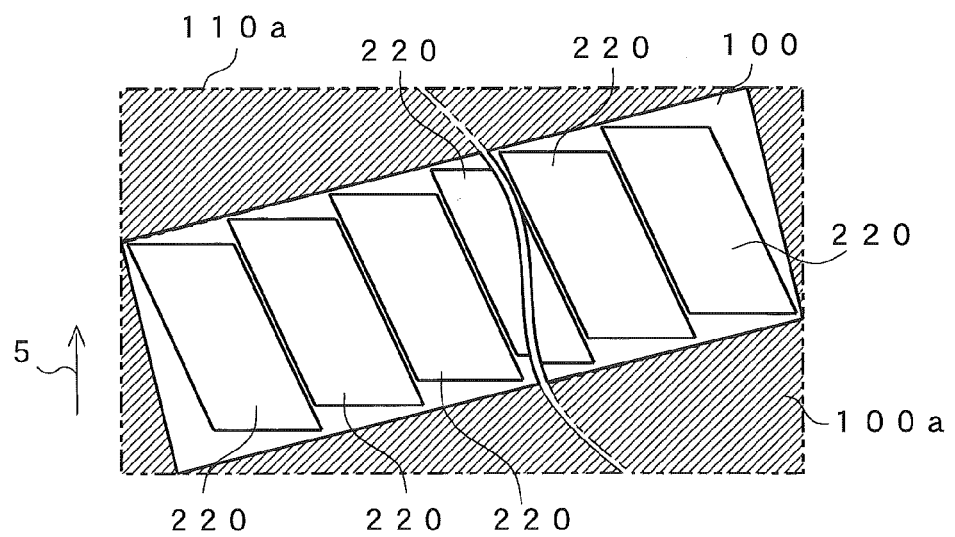
FIG. 7 is a plan view illustrating a microlens array as in a modification of the third embodiment.

In such a case, a holder would retain each of the microlens array chips 220 arrayed with an incline with respect to the scanning direction 5, and therefore it is necessary to use a slightly large holder 110a such as is illustrated with the two-dot dashed line in FIG. 7. However, in a case where the region of irradiation of the microlens array with the exposure light is broadened to match the size of the holder 110a of such description, then the exposure light with which the hatched section 100a in FIG. 7 is irradiated will be blocked at all times, and is wasted.

To prevent this waste of exposure light, for example, the holder need be only a holder 100 of which the outer edge is parallel with the direction of arraying of the microlens array chip 220, as illustrated with the solid lines in FIG. 7. When the light source is arranged at an incline with respect to the scanning direction so as to correspond to the shape of the holder 100, then the surface area irradiated with the exposure light can be reduced to match the holder 100.

In the embodiments described above, the polygonal viewing field diaphragms are the hexagonal viewing field diaphragms 2b and the columns of microlenses constituted a microlens column group every three columns, but the present invention is not limited thereto; a variety of modes are possible. For example, polygonal viewing field diaphragms that define the field of view on the substrate by the microlenses are not limited to being polygonal viewing field diaphragms; for example, the apertures may be diamond-shaped, parallelogram-shaped, trapezoid-shaped, or the like. For example, with trapezoid-shaped (quadrangular) viewing field diaphragms, the viewing field region can still be broken down into a middle rectangular portion and the triangular portions on both sides thereof. The columns of microlenses that constitute one microlens column group are also not limited to being three columns, and, for example, in the case of trapezoidal and parallelogram (horizontally long) apertures described above, one group is constituted for every three columns, but in the case of a diamond-shape and parallelogram-shape (vertically long), one group would be constituted every two columns.

Industrial Applicability

The present invention makes it possible to prevent the occurrence of ununiform exposure in a microlens array obtained by stacking a plurality of unitary microlens arrays, and therefore contributes to improving scanning exposure technologies.

Key
1, 2: microlens array
2-1, 2-2, 2-3, 2-4, 12a, 12b, 20-1, 20-2, 20-3, 20-4: unitary microlens array
2a: mark
2b: hexagonal viewing field diaphragm
2c: aperture diaphragm
3: mark
5: scanning direction
10: upper plate; 11: glass plate
12, 20, 21, 22, 23, 220: microlens array chip
13: lower plate
A: rectangular portion
B, C: triangular portion

What is claimed is:

1. A microlens array, in which the microlens array is moved along with a light source for emitting an exposure light, the exposure light coming from the light source is transmitted through a pattern formed on a mask, and an erect-same-size image of the mask pattern is formed through the microlens array by the light transmitted through the mask, comprising: a glass plate, and
a plurality of unitary microlens arrays which are stacked onto an upper surface and a lower surface of the glass plate, and are stacked on one another with a plurality of microlenses in a two-dimensional arrangement,
said unitary microlens arrays being constituted by arranging, in a second direction orthogonal to a first direction, a plurality of columns of microlenses constituted by arraying a plurality of microlenses in said first direction; a microlens column group being constituted of a predetermined number of columns of microlenses; a plurality of said columns of microlenses being arranged offset by increments of a fixed distance in said first direction in each of the microlens column groups; and a plurality of the microlens column groups being arranged in said second direction,
alignment marks being formed on each of said unitary microlens arrays and said glass plate, and said unitary microlens arrays and said glass plate being stacked onto each other aligned by the marks.

2. The microlens array as set forth in claim 1, wherein borders of each of said unitary microlens arrays in said first direction are inclined with respect to said second direction in correspondence with the fact that columns of microlenses that are adjacent in said second direction are offset by said fixed distance in said first direction.

3. The microlens array as set forth in claim 2, wherein the microlens array chips are constituted of said unitary microlens arrays and said glass plate, a plurality of said microlens array chips is arrayed in said first direction, and microlens array chips that are adjacent in said first direction have the microlens columns thereof shifted by one column or a plurality of columns in said second direction, the shifting forming a gap between the microlens array chips.

4. The microlens array as set forth in claim 1, further comprising polygonal viewing field diaphragms having a polygonal aperture arranged at positions of inverted image formation between said unitary microlens arrays, and aperture diaphragms that have a circular aperture and limit the numerical aperture of each of the microlenses, the aperture diaphragms being arranged, at least in part, of a section of maximum enlargement of the exposure light between said unitary microlens arrays.

5. The microlens array as set forth in claim 1, further comprising a holder for holding said unitary microlens arrays.

6. A scanning exposure device using a microlens array, comprising:
a light source for emitting exposure light;
a mask on which the exposure light coming from said light source is incident and in which a pattern with which to expose a substrate is formed;
a microlens array for forming on said substrate an erect same-size image of said pattern, light transmitted through said mask being incident thereon; and
a movement device for moving said light source and said microlens array in a relative fashion with respect to said mask and said substrate,
said micro-lens array having
a glass plate, and
a plurality of unitary microlens arrays which are stacked onto an upper surface and a lower surface of the glass plate, and are stacked on one another with a plurality of microlenses in a two-dimensional arrangement,
said unitary microlens arrays being constituted by arranging in a second direction, which is a movement direction, a plurality of columns of microlenses constituted by arraying a plurality of microlenses in a first direction, which is a direction orthogonal to said movement direction, a microlens column group being constituted of a predetermined number of columns of microlenses, a plurality of said columns of microlenses being arranged offset by increments of a fixed distance in said first direction in each of the microlens column groups, and a plurality of the microlens column groups being arranged in said second direction, alignment marks being formed on each of said unitary microlens arrays and said glass plate and said unitary microlens arrays and said glass plate being stacked onto each other aligned by the marks.

\* \* \* \* \*